United States Patent [19]

Siebold

[11] Patent Number: 4,881,035

[45] Date of Patent: Nov. 14, 1989

[54] MAGNETIC STRUCTURAL ARRANGEMENT OF AN INSTALLATION FOR NUCLEAR MAGNETIC RESONANCE TOMOGRAPHY WITH SUPERCONDUCTING BACKGROUND FIELD COILS AND NORMAL-CONDUCTING GRADIENT COILS

[75] Inventor: Horst Siebold, Erlangen, Fed. Rep. of Germany

[73] Assignee: Siemens Aktiengesellschaft, Munich, Fed. Rep. of Germany

[21] Appl. No.: 264,775

[22] Filed: Oct. 28, 1988

[30] Foreign Application Priority Data

Nov. 24, 1987 [DE] Fed. Rep. of Germany ....... 3739838

[51] Int. Cl.$^4$ ............................................. G01R 33/20
[52] U.S. Cl. ..................................... 324/320; 335/216
[58] Field of Search ....................... 324/318, 319, 320; 335/216, 296, 299, 301

[56] References Cited

U.S. PATENT DOCUMENTS

| | | | |
|---|---|---|---|
| 4,442,404 | 4/1984 | Bergmann | 324/309 |
| 4,771,243 | 9/1988 | Vreugdenhil et al. | 324/320 |
| 4,774,486 | 9/1988 | Moritsu | 324/318 |

FOREIGN PATENT DOCUMENTS

| | | |
|---|---|---|
| 139308 | 5/1985 | European Pat. Off. . |
| 0144171 | 6/1985 | European Pat. Off. . |
| 0164199 | 12/1985 | European Pat. Off. . |
| 0190767 | 8/1986 | European Pat. Off. . |
| 0216590 | 4/1987 | European Pat. Off. . |
| 0231879 | 8/1987 | European Pat. Off. . |
| 0238909 | 9/1987 | European Pat. Off. . |

OTHER PUBLICATIONS

8127 Rev. of Scientific Instruments, vol. 53 (Apr. 1982) No. 4, pp. 485–490.
Supraleitung, Werber Buckel, 3d ed., Weinhem 1984, pp. 140–156.
Elektrotechnik und Maschinenbau, vol. 96, No. 4, 1979, pp. 137–156.
J. Phys. D: Appl. Phys. 19 (1986) L129–L131.
J. Phys. E: Sci. Instrum., vol. 19 (1986) pp. 876–879.

Primary Examiner—Stewart J. Levy
Assistant Examiner—Kevin D. O'Shea
Attorney, Agent, or Firm—Kenyon & Kenyon

[57] ABSTRACT

Magnetic structural arrangement of an installation for nuclear magnetic resonance tomography with superconducting background field coils and normally conducting gradient coils. The magnetic structural arrangement contains superconducting coils cooled by a cryogenic medium for generating a homogeneous magnetic background field, normally conducting coils within the inner space bounded by the background field coils for developing magnetic field gradients, and at least one cooled radiation shield of an electrically and thermally conducting material which is disposed between the gradient coils and the background field coils. In such a structural arrangement the danger exists that eddy currents set up in the radiation shield distort the gradient fields and/or these gradient fields generate undesired heat in the region of the background field coils. To solve this problem, on the side of the background field coils facing the inner space, a tubular shielding structure is disposed which at least contains superconducting material of the second kind and is thermally coupled to the cryogenic medium of the background field coils, and the radiation shield is designed to suppress eddy currents induced in it at least by the gradient coils. The shielding structure can be formed, in particular, of several pre-fabricated shield elements. The magnetic structural arrangement is intended for installations for nuclear magnetic resonance tomography.

14 Claims, 4 Drawing Sheets

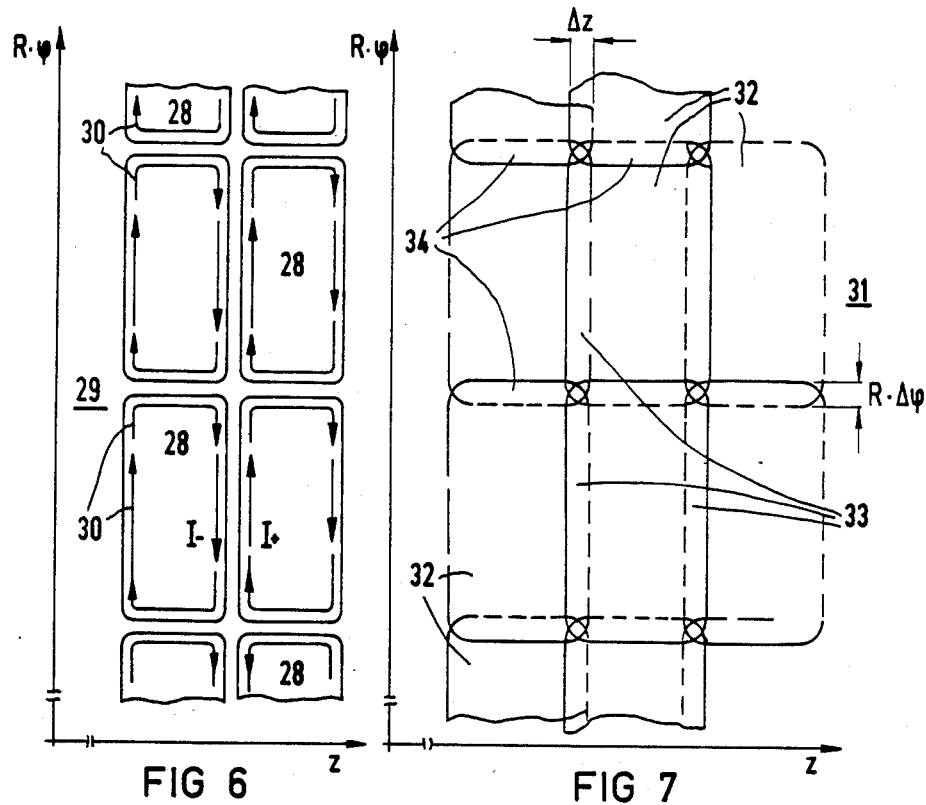
FIG 6   FIG 7
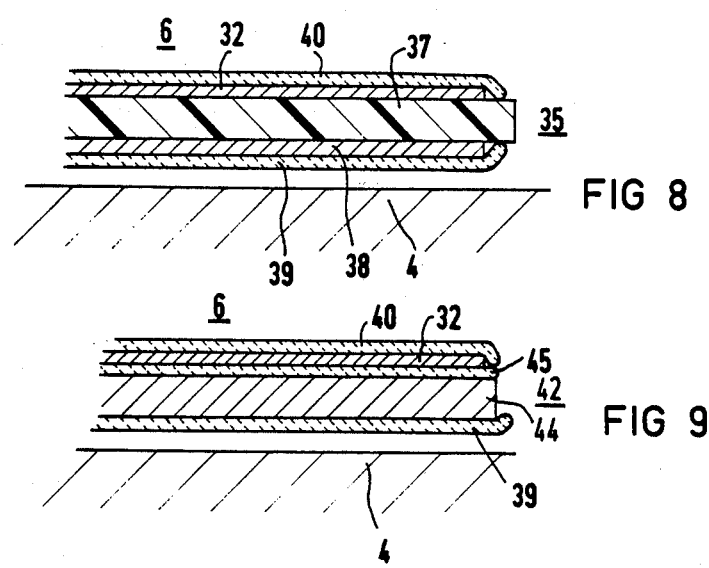
FIG 8
FIG 9

MAGNETIC STRUCTURAL ARRANGEMENT OF AN INSTALLATION FOR NUCLEAR MAGNETIC RESONANCE TOMOGRAPHY WITH SUPERCONDUCTING BACKGROUND FIELD COILS AND NORMAL-CONDUCTING GRADIENT COILS

BACKGROUND OF THE INVENTION

The present invention relates to a magnetic structural arrangement of an installation for nuclear magnetic resonance tomography with superconducting coils cooled by a cryogenic medium for generating a homogeneous magnetic background field, with normal-conducting coils within the interior bounded by the background field coils for forming magnetic field gradients as well as with at least one cooled radiation shield of electrically and thermally conducting material which is arranged between the normal-conducting gradient coils and the superconducting background field coils. A magnetic structural arrangement of this nature is indicated in EP-A-0 144 171.

In the field of medical technology, imaging diagnostic procedures have been developed in which integral resonance signals of nuclei of a given chemical element of a 17 body, in particular a human body, or parts of the body are analyzed by calculations and measurements. On the basis of the thus to be obtained spatial spin density and/or relaxation time distribution, an image similar to the X-ray tomograph of computer tomography can be reconstructed or calculated. Corresponding methods are known generally under the term nuclear magnetic resonance tomography or magnetic resonance imaging or spectroscopy.

A precondition for nuclear magnetic resonance tomography is a magnetic field generated by a so-called background field magnet into which a body or body part to be examined is introduced along an axis which in general aligns with the axis of orientation of the magnetic background field. The background field must be sufficiently homogeneous in a corresponding imaging or examination area and its magnetic induction in these regions may be up to several Tesla. Such high magnetic inductions can, however, cost-effectively only be generated with superconducting magnetic coils which must be placed in a corresponding cryo-system. Such a cryo-system also comprises at least one cooled radiation shield in order to limit heat introduction of room temperature onto the superconducting background field coils. Corresponding radiation shields are, therefore, manufactured in general of thermally and, hence, also of electrically high-conducting material. The magnetic background field is superimposed by stationary and/or pulsed so-called gradient fields which are created by normal-conducting coils which are arranged within the inner space bounded by the cryo-system of the background field coils and are, in general, at approximately room temperature. For excitation with respect to a precession 17 motion of the individual atomic nuclei in the body or the body part, further, a special antenna device is required with which briefly a high-frequency magnetic alternating field can be generated. This antenna device can potentially also be used to receive the high-frequency signals produced by the thus excited atomic nuclei.

According to EP-A-0 144 171, the radiation shield of a superconducting background field coil system or its cryo-system is made of an electrically high-conducting material such as, for example, aluminum. In such a radiation shield, however, eddy currents are induced by the normal-conducting gradient coils which, in turn, regenerate gradient fields in the effective volume of the examination region.

Without special countermeasures, however, this brings about lack of sharpness of the images to be obtained. In this connection in radiation shields of known magnetic structural arrangements it is, in general, also not practicable to fabricate these so as to be non-shielding, for example, by using electrically low-conducting materials or with slits. In that case, the gradient fields can penetrate into the helium-cold region of the superconducting background field coils and there generate quantities of heat which are, given the very low operating temperature, particularly disturbing.

In connection with this set of problems, two countermeasures are primarily known which, however, are relatively elaborate:

(1) The magnetic field of the eddy current induced in a corresponding radiation shield is approximately 10 to 30% of the direct gradient field. The field connected to it is opposite to the original one, i.e. it thus attenuates it. The effect can be taken into consideration when laying-out and designing the gradient coils (cf. for example "J. Phys. E.", Vol. 19, 1986, pages 876 to 879 or EP-A-0 164 199).

(2) It is further known, for example from "J. Phys. D.", Vol. 19, 1986, pages L129 to L131 to introduce an additional system of gradient coils which is disposed between the actual primary gradient coil system and the radiation shield as close as possible to this shield. The limited space in the interior in this arrangement in the generally solenoidal superconducting background field leads to difficulties.

SUMMARY OF THE INVENTION

It is an object of the present invention to implement the magnetic structural arrangement of the initially mentioned kind so that the problems occurring with the known countermeasures due to eddy current formation in the radiation shield are decreased. In the process, however, the thermal shielding effect of the radiation shield is to be at least largely retained.

The above and other objects of the invention are achieved by a magnetic structural arrangement of an installation for nuclear magnetic resonance tomography having superconducting background field coils cooled by a cryogenic medium for generating a homogeneous magnetic background field, with normal-conducting coils within an inner space bounded by the background field coils for forming magnetic field gradients, and at least one cooled radiation shield of electrically and thermally conducting material disposed between the normal-conducting gradient coils and the superconducting background field coils, on the side of the background field coils facing the inner space a tubular shielding structure being disposed which at least contains superconducting material of the second kind and is thermally coupled to the cryogenic medium of the background field coils, the radiation shield being configured to suppress eddy currents induced in it at least by the gradient coils.

By superconducting material of the second kind (or of type II) here, in general, is understood any material which during the undisturbed operating state of the magnetic structural arrangement has in the stationary field of the background field coils and in the alternating field of the gradient and HF coils a sufficient current density (current carrying ability) in order to carry loss-free, at least to a large extent, the currents induced in it without these being gradually attenuated in time due to an electrical resistance. The magnetic background field of the superconducting background field coils, is to be able to penetrate the superconducting material (cf. for example textbook by W. Buckel: "Supraleitung" [Superconduction], 3rd edition, Weinheim 1984, pages 140 to 166 or "Electrotechnik und Maschinenbau"[Electrical Engineering and Mechanical Engineering], Vol. 96, No. 4, 1979, pages 137 to 156).

The advantages connected with the implementation of the magnetic structural arrangement according to the invention can be seen in particular in that the function of thermal shielding and electromagnetic shielding of the gradient field against the cryogenic area of the super-conducting background field coils are now uncoupled. The background field, due to the use of a superconductor of the second kind, is pushed out 17 of the layer-like structure to only a minor degree due to a 18 slight residual diamagnetism and, hence, changed correspondingly only slightly in the effective volume. The gradient field occurring in the operating case, thus, sets up currents in the layer-like structure which are no longer attenuated by Joule losses. The frequency response is, therefore, to a large extent smooth down to the lowest frequencies.

A further advantage consists in that now radiation shields can be used which are designed with respect to suppression of eddy current formation in general. Corresponding measures for eddy current suppression are generally known. These measures may, in particular, involve additionally that in a potential quench of background field coils, i.e. upon their unintentional transition from the superconducting to the normal-conducting state, advantageously no large eddy currents and, consequently, forces in the radiation shield can occur.

An additional advantage of the measures according to the invention is to be seen in that external time-dependent interference fields, which are present after a so-called shimming (homogenization) of the background field coils, are largely kept away from the effective volume.

BRIEF DESCRIPTION OF THE DRAWINGS

For further elucidation of the invention, reference is made below to the schematic drawings in which:

FIGS. 5 to 7 show further embodiments of shielding structures;

FIGS. 8 to 11 show heating arrangements on shielding structures; and

Like parts corresponding in the figures are provided with like reference numbers.

DETAILED DESCRIPTION

Figure 1:
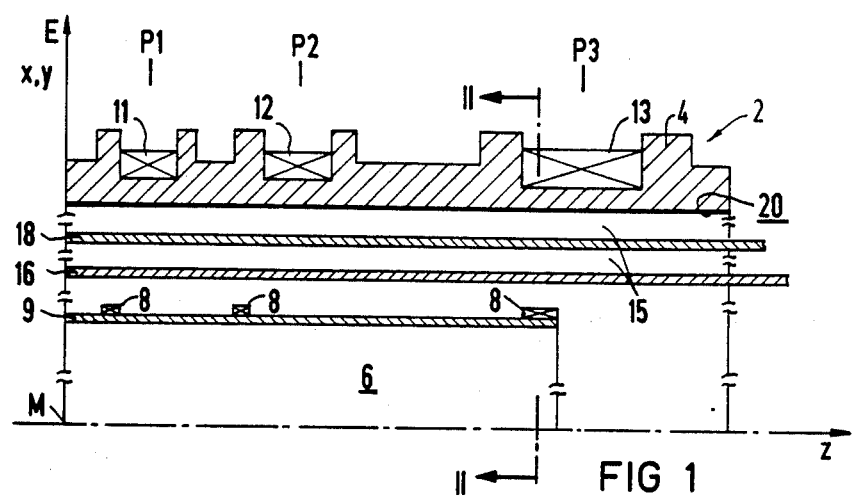
FIGS. 1 and 2 show a magnetic structural arrangement with a radiation shield.

The magnetic structural arrangement according to the invention according to FIG. 1 builds on known designs as they are provided for imaging installations for nuclear magnetic resonance tomography (cf. for example, the mentioned EP-A-0 144 171). A structural arrangement of such nature contains, in general, several pairs of superconducting coils for generating a magnetic background field in the direction of the z-axis of an orthogonal x-y-z system of coordinates. This background field is sufficiently homogeneous in an imaging region or effective volume in whose center M the origin of the coordinates of this system of coordinates is to be. The magnetic structural arrangement is to permit axial access to this homogeneous imaging region, i.e. a body, for example, a human body, to be examined, is introduced along the z-axis into this field region. Corresponding magnetic structural arrangements are, therefore, preferably fabricated rotationally symmetrical. The magnetic structural arrangement for nuclear magnetic resonance tomography indicated schematically in FIG. 1 only partially in longitudinal section and denoted in general by 2 is to have, for example, six annular superconducting background field coils arranged sequentially along the z-axis. In each instance two of these coils are arranged symmetrically with respect to the plane E extending through the x-y axes of the system of coordinates so that three pairs P1, P2, and P3 of background field coils result. In the figures only the parts of the magnetic structural arrangement 2 are shown in greater detail which lie on one side of this plane of symmetry E and above the z-axis. Hence, the coil pair P1 through its background field coil 11, the coil pair P2 through its background field coil 12 and the coil pair P3 through its background field coil 13 are illustrated. The background field coils of the magnetic structural arrangement may be arranged in particular in corresponding grooves of a sturdy hollow-cylindrical coil form 4 of non-magnetic material (cf. for example EP-A-0 238 909). This coil form is also cooled by the cryogenic medium required for cooling the superconducting background field coils. Within the cylindrical interior space 6 of the magnetic structural arrangement 2 bounded by the coil pairs or their common coil form 4, in addition, normal-conducting gradient coils known per se and, further, normally conducting HF-coils are still to be arranged. In the figures only, for example, saddle-shaped x-y gradient coils are indicated and labeled 8. These gradient coils 8 fastened, for example, on a tubular support 9 are at approximately room temperature so that a thermal shielding between them and the highly-cooled superconducting background field coils 11 to 13 is required. This purpose is served by a vacuum chamber 15 which encloses the coil form 4 with the superconducting background field coils 11 to 13. In this vacuum chamber 15 enclosed by a corresponding vacuum vessel 16, a thermal shield 18 variously also called cold shield or radiation shield is disposed which is formed so that eddy currents induced in it by the gradient coils are at least largely suppressed. The vacuum vessel 16 consists preferably of an electrically poorly conducting material such as, for example, special steel or of a fiber glass reinforced synthetic material.

Figure 2:
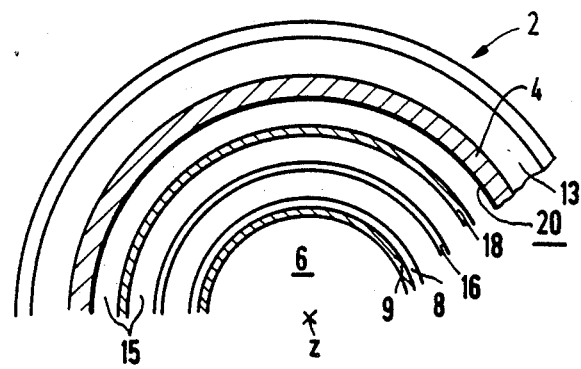

In FIG. 2 is reproduced schematically a cross section through the magnetic structural arrangement 2 shown in FIG. 1 along a cutting plane labeled II—II.

According to the invention, on the side of the superconducting background field coils 11 to 13 facing the inner chamber 6 an electromagnetic shielding structure 20 is to be provided with which the gradient fields are hindered from penetrating into the cryo-region of the background field coils. For this reason the at least largely tubular structure is to consist of a superconducting material of the second kind or of Type 11 or contain parts of this material. The structure according to the embodiment shown in FIGS. 1 and 2 is attached directly on the inside of the coil form 4 in the form of a layer of a film of the superconducting material. In this way a thermal contact with the cold coil form is ensured so that the layer in normal operation can be kept below the transition temperature of its superconducting material. The layer functioning as shielding structure 20 can optionally be applied directly on the coil form, for example, by sputtering or vapor deposition.

Figure 3:
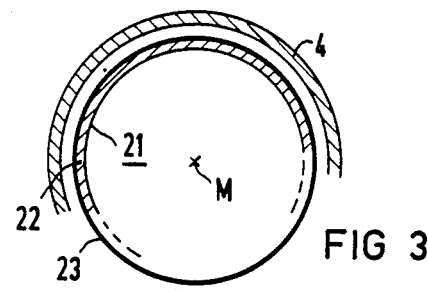
FIGS. 3 and 4 show two designs of shielding structures of this arrangement.

As is schematically indicated in FIG. 3 in section, a shielding structure 21, optionally also a particular cylinder cover 22 of, for example, an electrically and magnetically non-conducting material, can be used which functions solely as the support of a superconducting layer 23. If in this 18 arrangement no direct contact is given with the cold coil form 4, a cooling arrangement for the superconducting layer 23 must additionally be provided in known manner.

In general, however, it is not absolutely required that the superconducting layer 23 according to FIG. 3 represents a closed cylinder surface of a shielding structure in order to be able to shield the gradient fields. This would only be necessary if a homogeneous field, in particular of the type of the background field, would also need to be shielded. Instead, according to FIGS. 4 and 5, also a rectangular superconducting foil 25 having the dimensions $(2\pi + \Delta 0100) * R * z$-length can be manufactured which after introduction into the coil form 4 has an overlap $R * \Delta \rho$. R is the radius of the superconducting foil 25 bent to form a tubular structure and $\rho$ the azimuthal angle in an x-y-z system of coordinates (cf. FIG. 4). Eddy currents, also in the azimuthal $\rho$-direction, as they are induced by z-gradients, can then close in an overlap region 26 of magnitude $R * \Delta \phi$. Corresponding eddy currents are indicated in the sketch of FIG. 5 and labeled 27. In FIG. 5, foil 25 of FIG. 4 spread out in a $R* \rho$—Z—plane is shown.

Figure 4:
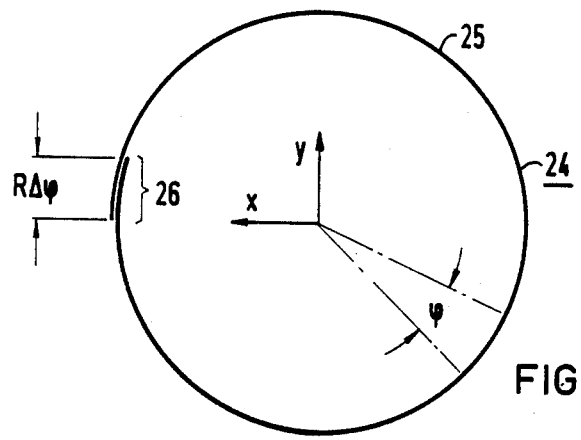
Figure 5:
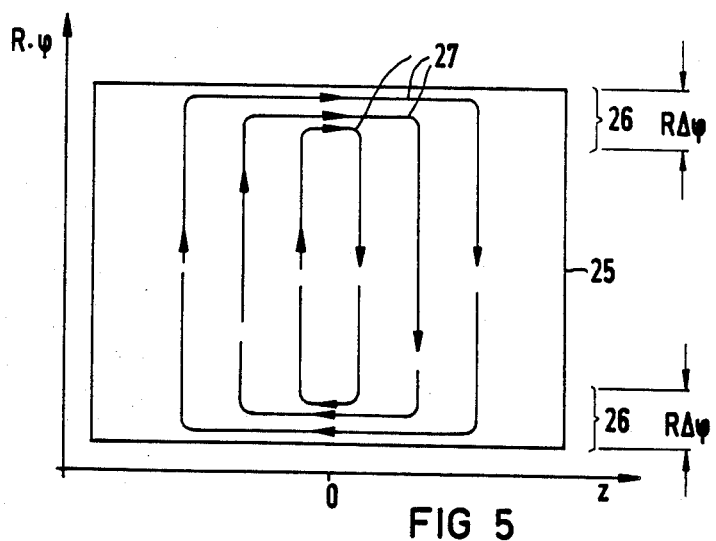

According to FIGS. 4 and 5 the assumption was made that a foil 25 made of the superconducting material with the dimensions adapted to the coil form 4 and relatively extended proportions is available. However, it is also possible to divide the superconducting area of the tubular shielding structure to be formed also in easy-to-handle individual areas which can be built cost-effectively. For example, with rectangular or hexagonal area elements the large surface can be continuously covered. In this connection, reference is initially made to the sketch of FIG. 6 in which only a few rectangular areal or shielding elements 28 are indicated in a representation corresponding to FIG. 5. These shielding elements of a shielding structure 29 are not to be galvanically (electrically conducting) connected with each other. The eddy currents induced in the shielding elements must then represent current loops 30 always closed on it. An eddy current ring of strength $I\rho$, induced in the circumferential direction $\rho$, actually only closed over the entire circumference, as it would be generated, for example, by a z-gradient coil lying below it, then presents itself as difference of the edge currents I—) and (I+) of neighbouring elements. This leads to the situation that the current densities at the edges are particularly high. The superconducting material must, therefore, be capable of a correspondingly high current density.

A particularly advantageous embodiment of a tubular superconducting shielding structure according to the invention with reduced requirements of the current carrying ability of its superconducting material is shown in the sketch of FIG. 7 in a representation according to FIG. 5 or FIG. 6. The structure labeled generally 31 and realized only as a segment is formed by individual shielding elements 32 which overlap in regions 33 and 34 by $\Delta z$ or $R * \Delta \rho$. The edge currents illustrated in FIG. 6 then are distributed over a finite width, specifically over the overlap areas arranged radially above one another and can be limited to the desired ampere turns per cm $K=I/\Delta z$ or $I/(R * \Delta \rho)$. Here the manner of overlap, thus: in which sequence the elements are mounted to the coil form from the inside, is advantageously from the point of view of their function of no significance and can be determined solely on the basis of the aspect of manufacturing technology. If, for example, extended long webs from stock production are available then the special cases shown in FIG. 7 can be realized: specifically continuous strips in the z-direction with $R * \Delta \rho$-overlap or strips encircling the cylinder circumference once with only one $R * \Delta \rho$ overlap and in each instance $\Delta z$-overlaps.

To determine the requisite layer thicknesses of the superconducting material to be used the maximum occurring ampere turns per cm K can then be readily estimated. It follows that for commercially available nuclear magnetic resonance tomography installations, the layer thicknesses are of the order or magnitude between 0.5 $\mu$m and 5 $\mu$m. Thicker layers can, of course, also be provided.

The manufacture of the individual shielding elements according to FIGS. 6 and 7 can take place by means of known technologies. Thus, for example, superconducting layers can be applied on a synthetic material film by sputtering, in particular by DC magnetron sputtering, with sputtering taking place either with the already prepared alloy or with two sources with the particular starting materials of the superconductor. Materials suitable for the shielding structure according to the invention are generally known (cf. for example EP-A-0 190 767). Prefabricated, rolled-out foils, for example NbTi foils, can be fastened on a support by adhesion. In order to circumvent potentially occurring problems with respect to brittleness of the superconducting material, the superconducting material can optionally also be generated in known manner "in situ", i.e. only in approximately final form. Thus, for example, an Nb foil can be sputtered with Ti and prepared after final shaping by a diffusion process by means of heat treatment to yield a desired NbTi layer. Further, the Nb can, for example, also be deposited electrolytically on a heat resistant support and the Ti again be introduced by means of sputtering and diffusion.

Upon field changes of the background field coils, for example during their excitation, the shielding elements 28 or 32 shown, for example, in FIGS. 6 and 7, eddy currents are likewise induced. These eddy current must be brought exactly to zero so that the calculated homogeneity of the magnetic field to be generated by the background field coils is achieved. In general, it can be assumed that the superconducting layer of the tubular shielding structure according to the invention quenches, i.e. changes over to normal conducting, and that, thereby, the eddy currents are broken down essentially automatically. It is, however, advantageous to provide a special heating arrangement for the particular tubular structure in order to be able to achieve at any time the current-free state in a well-defined manner.

To this end, the individual shielding elements must each have, in addition, a normal-conducting coating, for example of copper or aluminum, or its support itself consists of an electrically conducting material. The heating arrangements of the individual shielding elements must be electrically connected with each other so that by means of a suitable series or parallel circuit a desired overall resistance is obtained and a connecting line of a cryogenic system can be applied.

In addition, a normal-conducting layer functioning as a heating arrangement must be electrically insulated from the superconducting material so that it is not short-circuited by it. For the same reason a corresponding heating element layer must also be insulated against the coil form should the latter be manufactured of an electrically conducting material; this can be achieved, for example, by a separate synthetic foil or by an insulating layer. One corresponding layer structure segment of each is shown schematically in FIGS. 8 and 9.

According to FIG. 8 the starting point is a tubular superconducting shielding structure 35 whose superconducting shielding elements 32 are applied on a special synthetic material support 37. On the side of this synthetic material support 37 facing the coil form 4 a heating element layer 38 is arranged functioning as heating arrangement. This heating element layer 38 is insulated against the electrically conducting coil form 4 by an insulating layer 39. The superconducting shielding elements 32 are, thus, always arranged advantageously toward the inside, facing the not shown gradient coils. They are covered in the rearward direction by an additional insulating layer 40.

According to the structure shown in FIG. 9 the starting point is a superconducting shielding structure 42, whose superconducing shielding elements 32 are supported by a metallic body 44. This body 44 functions simultaneously as heating arrangement. It is separated from the superconducting shielding elements 32 by a special insulating layer 45.

Figure 10:
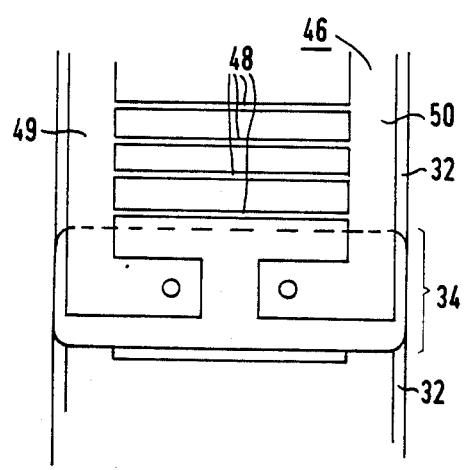
Figure 11:
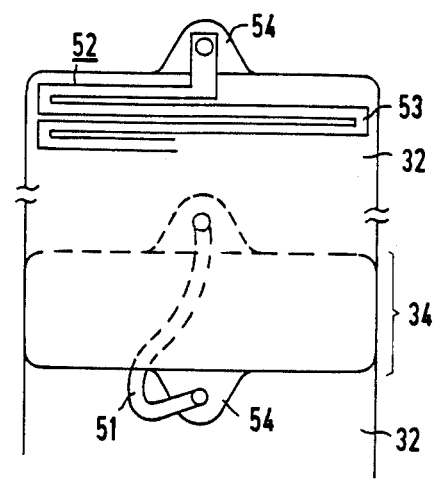

In FIGS. 10 and 11 connection alternatives of the heating arrangements assigned to individual shielding elements are schematically illustrated.

In FIG. 10 two shielding elements are shown which are, for example, the elements 32 according to FIG. 7. These elements form an overlap region 34. In order to make a parallel connection of the heating circuits of a heating arrangement 45 possible, two contacts per edge are required. The current supply to the next element requires two contacted edges. The corresponding contacts are here realized by means of feed-through rivets or screws. Around the opening the superconducting layer of the particular element should be kept somewhat off-set in order to avoid short circuits in this manner. The Joule heating output is converted in the thin webs 48 which extend between the conductor tracks 49 and 50 on the edges of the individual elements. The remaining area is also heated through heat conduction in the element.

According to FIG. 11 shielding elements 32 are provided whose heating arrangements 52 by means of a flexible conductor strip 51 are connected in the overlap region 34 of the elements to form a series circuit. A switchback structure of a heating element layer 53 is in this instance suitable. This layer ends in lobes 54 which are free of the superconducting material. The individual shielding elements can then be, so-to-speak, preassembled to form a chain, inserted into the coil form and there need only be mechanically secured. For this purpose, for example screws or clips can be provided which are advantageously arranged in the center of the individual elements.

It is understood that the contact technique according to FIG. 10 can also be combined with the series circuit according to FIG. 11 and conversely.

Figure 12:
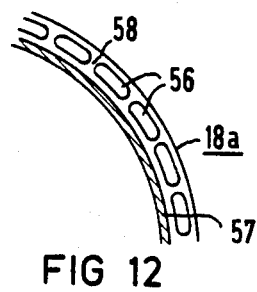
FIGS. 12 and 13 show in each instance an embodiment of a radiation shield for a magnetic structural arrangement according to the invention.

According to the invention, electromagnetic shielding of the gradient fields against the superconducting background field coils 11 to 13 is effected with the superconducting shielding structures shown in the figures. The at least one radiation shield 18 additionally required for the magnetic structural arrangement according to the invention in that case does not need to be layed out with regard to electromagnetic shielding. It can, therefore, in a manner known per se be so designed that in it through the gradient coils or in the event of a quench of a background field coil, no large eddy currents and, hence, potentially also no forces that are too large occur. For this reason the radiation shield is advantageously provided with a longitudinal slit. As an embodiment, a part of a corresponding radiation shield is schematically illustrated in FIG. 12 in cross section and labeled 18a. This shield is composed essentially of a multiplicity of thin-walled tubes which consist of, for example, special steel. These tubes extend parallel to each other in the axial ($z-$) direction and, seen in the circumferential direction, are closely adjacent to each other. However, they should advantageously be electrically insulated against each other. According to the shown embodiment, to this end, the individual tubes denoted by 6 are mounted, electrically insulated on a thin tubular support 57, for example by adhesion. The corresponding layer of adhesive which ensures the electrical insulation of tubes 56 against each other is referred to in the figures by 58. Hence, a longitudinally slit structure of the radiation shield 18a results.

The thin tubular support 57 can consist of an electrically poorly conducting sheet metal such as, for example steel, or of plastic. Optionally it is also possible, to omit this support altogether. The cooling tubes 56 mechanically connected to each other must then represent a sufficiently intrinsically-stable cylindrical structure and/or be held correspondingly stable at their front faces.

Figure 13:
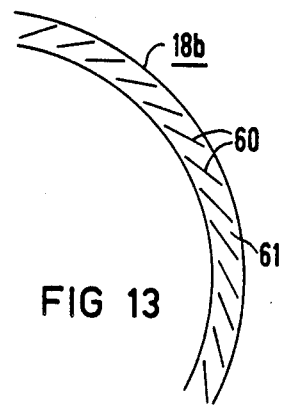

In FIG. 13, a further embodiment of a longitudinally slit radiation shield in a representation corresponding to FIG. 12 is shown schematically. This radiation shield denoted by 18a is composed of, seen in the circumferential direction, overlapping metal strips 60, electrically insulated against each other, which are fastened by means of electrical insulation 61 to form a tubular structure. The metal strips 60 must consist of a material which is a good heat conductor in order to be able to divert the incident heat in the axial ($z-$) direction to the front faces of the radiation shield. There they are thermally coupled to correspondingly cold parts of the magnetic structural arrangement.

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. A magnetic structural arrangement of an installation for nuclear magnetic resonance tomography having superconducting background field coils cooled by a cryogenic medium for generating a homogeneous magnetic background field, normal-conducting coils within an inner space bounded by the background field coils for forming magnetic field gradients, and at least one cooled radiation shield of electrically and thermally conducting material which is disposed between the normal-conducting gradient coils and the superconducting background field coils, on the side of the background field coils facing the inner space a tubular shielding structure being disposed which at least contains superconducting material of the second kind and is thermally coupled to the cryogenic medium of the background field coils, the radiation shield being configured to suppress eddy currents induced in it at least by the gradient coils.

2. The magnetic structural arrangement recited in claim 1, wherein the shielding structure contains the superconducting material in the form of a layer or a foil.

3. The magnetic structural arrangement recited in claim 2, wherein the superconducting material of the shielding structure is disposed on a support.

4. The magnetic structural arrangement recited in claim 1, wherein the background field coils are mounted on a cooled coil form on the inside of which is mounted the shielding structure.

5. The magnetic structural arrangement recited in claim 1, wherein the shielding structure is fabricated from a rectangular superconducting foil, with an overlap region being formed at the longitudinal edges of the foil.

6. The magnetic structural arrangement recited in claim 1, wherein the shielding structure is composed of several pre-fabricated shield elements.

7. The magnetic structural arrangement recited in claim 6, wherein overlap regions are formed in the shield elements at edges facing each other.

8. The magnetic structural arrangement recited in claim 6, wherein the individual shield elements are of rectangular shape.

9. The magnetic structural arrangement recited in claim 1, wherein the shielding structure is provided with a heating arrangement which is electrically insulated against the superconducting material of the shielding structure.

10. The magnetic structural arrangement recited in claim 9, wherein the heating arrangement contains a heating element layer which is thermally coupled via an insulating layer to the superconducting material of the shielding structure.

11. The magnetic structural arrangement recited in claim 1, wherein the radiation shield has a longitudinally slit structure of its metallic parts.

12. The magnetic structural arrangement recited in claim 11, wherein the radiation shield contains thin-walled cooling tube means which are disposed parallel to each other in the axial direction of the shield and electrically poorly conducting with respect to each other.

13. The magnetic structural arrangement recited in claim 11, wherein the radiation shield contains thin metal strips of thermally well conducting material which in the axial direction of the shield are disposed parallel to each other and are overlapping in the circumferential direction of the shield and are electrically insulated against each other.

14. The magnetic structural arrangement recited in claim 1, wherein the superconducting background field coils and the at least one radiation shield are disposed in a vacuum vessel which comprises an electrically poorly conducting material.

* * * * *